(12) United States Patent
Buelow, II et al.

(10) Patent No.: US 8,347,492 B2
(45) Date of Patent: Jan. 8, 2013

(54) METHOD OF MAKING AN ARRANGEMENT FOR COLLECTING OR EMITTING LIGHT

(75) Inventors: Roger F. Buelow, II, Gate Mills, OH (US); Lazlo Takacs, Lakewood, OH (US); Baris E. Karadag, Twinsburg, OH (US); Darrell W. Popovich, Twinsburg, OH (US); Christopher H. Jenson, Twinsburg, OH (US); Keith D. Kazenski, Twinsburg, OH (US)

(73) Assignee: Energy Focus, Inc., Solon, OH (US)

( * ) Notice: Subject to any disclaimer, the term of this patent is extended or adjusted under 35 U.S.C. 154(b) by 179 days.

(21) Appl. No.: 13/022,206

(22) Filed: Feb. 7, 2011

(65) Prior Publication Data

US 2011/0192005 A1 Aug. 11, 2011

Related U.S. Application Data

(60) Provisional application No. 61/301,940, filed on Feb. 5, 2010, provisional application No. 61/304,882, filed on Feb. 16, 2010.

(51) Int. Cl.
*H01R 43/00* (2006.01)

(52) U.S. Cl. ............... 29/825; 29/842; 29/846; 29/874; 29/884

(58) Field of Classification Search ............ 29/825, 29/842, 846, 874, 884
See application file for complete search history.

(56) References Cited

U.S. PATENT DOCUMENTS

| | | | |
|---|---|---|---|
| 4,466,705 A | 8/1984 | Michelson | |
| 5,229,624 A | 7/1993 | Marks | |
| 5,255,171 A * | 10/1993 | Clark | 362/231 |
| 5,520,747 A | 5/1996 | Marks | |
| 5,902,417 A | 5/1999 | Lillington et al. | |
| 6,624,351 B2 | 9/2003 | Kular et al. | |
| 7,317,576 B2 | 1/2008 | Van Nutt et al. | |
| 7,741,557 B2 | 6/2010 | Cobb et al. | |
| 2001/0011551 A1 | 8/2001 | Peumans et al. | |
| 2005/0135113 A1 * | 6/2005 | Wang et al. | 362/561 |
| 2007/0199563 A1 | 8/2007 | Fox | |
| 2007/0235073 A1 | 10/2007 | Napolitano | |
| 2008/0012151 A1 | 1/2008 | Kemppainen et al. | |
| 2008/0053515 A1 | 3/2008 | Paull | |
| 2009/0000612 A1 | 1/2009 | Hines et al. | |
| 2009/0260621 A1 | 10/2009 | Soucy | |
| 2009/0320913 A1 | 12/2009 | Smith et al. | |
| 2010/0212716 A1 | 8/2010 | Lerner et al. | |

* cited by examiner

*Primary Examiner* — Carl Arbes

(74) *Attorney, Agent, or Firm* — Charles E. Bruzga; Bruzga & Associates

(57) ABSTRACT

Disclosed is a method of making an arrangement for collecting or emitting light. A flexible sheet of material serves as substrate for a plurality of light collecting or emitting devices mounted in spaced relation on the sheet. The sheet has thereon electrical leads for interconnection to each device. For each device, a respective light coupler is formed by (1) forming a plurality of reflectors on the sheet around the intended periphery of the respective device, by applying reflective material to selected areas of the sheet; (2) forming cut lines around selected edges of the plurality of reflectors; (3) forming fold lines associated with the reflectors; and (4) folding the reflectors and attached substrate away from the substrate portion on which the device is mounted, to form a coupler whose interior is reflective and that is substantially closed around a main axis of light propagation into or from the respective device.

15 Claims, 18 Drawing Sheets

METHOD OF MAKING AN ARRANGEMENT FOR COLLECTING OR EMITTING LIGHT

CROSS-REFERENCE TO RELATED APPLICATIONS

This application claims priority from U.S. Provisional Patent Application No. 61/301,940, filed 5 Feb. 2010 and from U.S. Provisional Patent Application No. 61/302,882, filed 16 Feb. 2010. Each of the foregoing applications is incorporated herein by reference in its entirety.

FIELD OF THE INVENTION

The present invention relates to a method of making an arrangement for collecting or emitting light. More particularly, the invention relates to such a method that utilizes a flexible sheet of material as a substrate for a plurality of light collecting or emitting devices.

BACKGROUND OF THE INVENTION

One type of device for collecting light and converting it to electricity is a photovoltaic (PV) cell, as used in a solar collector. PV solar collector arrangements are available in two basic varieties, non-concentrating and concentrating with respect to light received. The reference to "concentrating" typically refers to collection optics associated with a PV solar collector arrangement. "Non-concentrating" solar collector arrangements rely on the sun shining directly onto the surfaces of photovoltaic cells that receive light for the purpose of conversion into electricity. Non-concentrating PV solar arrangements typically require large areas of PV devices to collect enough light to produce a suitable amount of electricity. Concentration of light by using light concentrating optics causes collection of light from a specified area and focuses that light into a smaller area, reducing the area of the desired light-collecting PV cells significantly.

Silicon-based PV cells are noted for low light-to-electricity conversion efficiency. However, their relatively low cost makes them suitable for non-concentrating systems. More costly PV devices, such as gallium-arsenide (III-V devices), can be significantly more efficient at converting light to electricity, but are also significantly more expensive than silicon-based devices. The more costly PV devices are thus more suitable for concentrating systems. By making use of light-concentrating collection systems, the size of required PV devices can be significantly reduced, allowing in some cases the use of the higher cost, more efficient, III-V photovoltaic devices.

In addition to light concentration, the PV devices or arrays of PV devices are often fixed to tracking devices that orient the light couplers, or collectors, in an optimal manner for collecting solar energy. The typical relationship is that, the higher the amount of concentration, the higher the degree of accuracy that is needed for a light tracking system. Typically, the cost of the tracking device correlates directly with the required degree of accuracy. Single-axis collectors are often most concerned with tracking in one direction, while dual-axis collectors are often concerned with tracking in two directions. The degree of tracking accuracy on each axis depends on the degree of concentration on each axis.

It would be desirable to provide a method of making an arrangement for collecting (or emitting) light, key parts of which can be performed using automated, mass production techniques. It would further be desirable to provide such a method in which the arrangement for collecting light forms a two-axis concentrator with a medium level of concentration. Since the concentration is divided between two axes, the need for a high level of tracking accuracy is reduced, allowing for lower cost options for tracking equipment.

BRIEF SUMMARY OF THE INVENTION

The present invention provides, in one form, a method of making an arrangement for collecting or emitting light. The method comprises providing a flexible sheet of material as a substrate for a plurality of light collecting or emitting devices. The plurality of light collecting or emitting devices is mounted in spaced relation on the sheet. The sheet has thereon electrical leads for interconnection to each light collecting or emitting device. For each light collecting or emitting device, a respective light coupler is formed by (1) forming a plurality of reflectors on the sheet around the intended periphery of the respective light collecting or emitting device, by applying reflective material to selected areas of the sheet; (2) forming cut lines around selected edges of the plurality of reflectors; (3) forming fold lines associated with the reflectors; and (4) folding the reflectors and attached substrate away from the substrate portion on which the light collecting or emitting device is mounted, to form a coupler whose interior is reflective and that is substantially closed around a main axis of light propagation into or from the respective light collecting or emitting device.

The foregoing invention provides a method of making an arrangement for collecting (or emitting) light, key parts of which can be performed using automated, mass production techniques. The foregoing invention further provides such a method in which the arrangement for collecting light forms a two-axis concentrator with a medium level of concentration, in which the need for a high level of tracking accuracy is reduced, allowing for lower cost options for tracking equipment.

BRIEF DESCRIPTION OF THE DRAWINGS

In the following drawings, like reference numbers refer to like parts.

DETAILED DESCRIPTION OF THE PREFERRED EMBODIMENT

Figure 1:
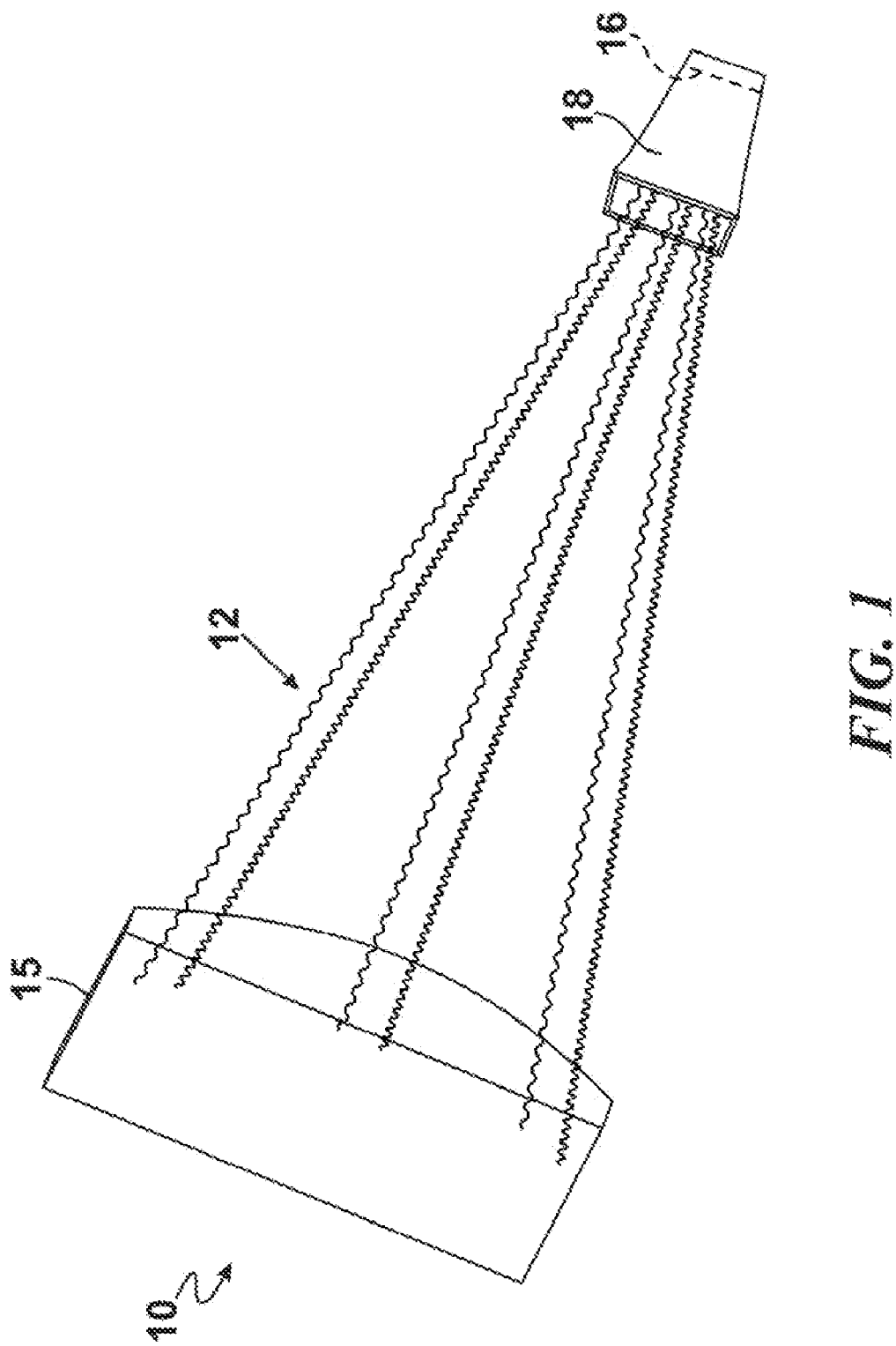
FIG. 1 is a perspective view of a conceptual arrangement for transmitting light between a lens and a light collecting or emitting device.

FIG. 1 shows a conceptual arrangement 10 for the transmission of light 12 between a lens 15 and a light collecting or light emission device 16. Device 16 may be a PV cell or an LED, by way of example. The arrangement 10 is conceptual, because, for instance, no substrate is shown for the device 16. A light coupler 18 having a reflective interior couples light 12 to device 16.

Figure 2:
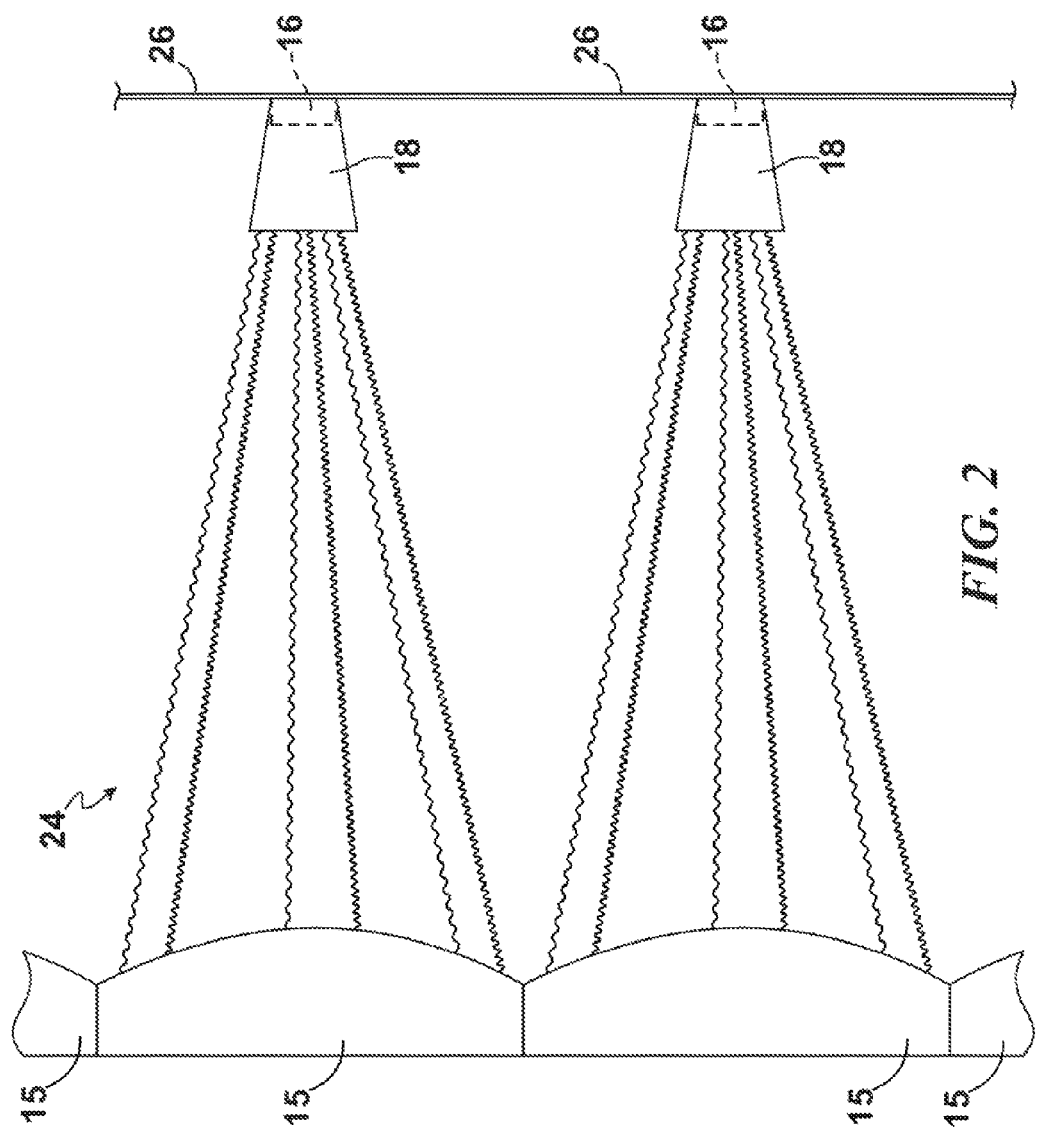
FIG. 2 is a side view of an arrangement that implements the arrangement of FIG. 1

To make arrangement 10 of FIG. 1 in a simple and economical manner, an arrangement 24 as shown in FIG. 2 has been developed by the present inventors. Arrangement 24 includes a flexible substrate 26 on which light collecting or emitting devices 16 are mounted. Further, the flexible substrate 26 itself is used as part of the structure to make light couplers 18, as will now be described below.

Figure 3:
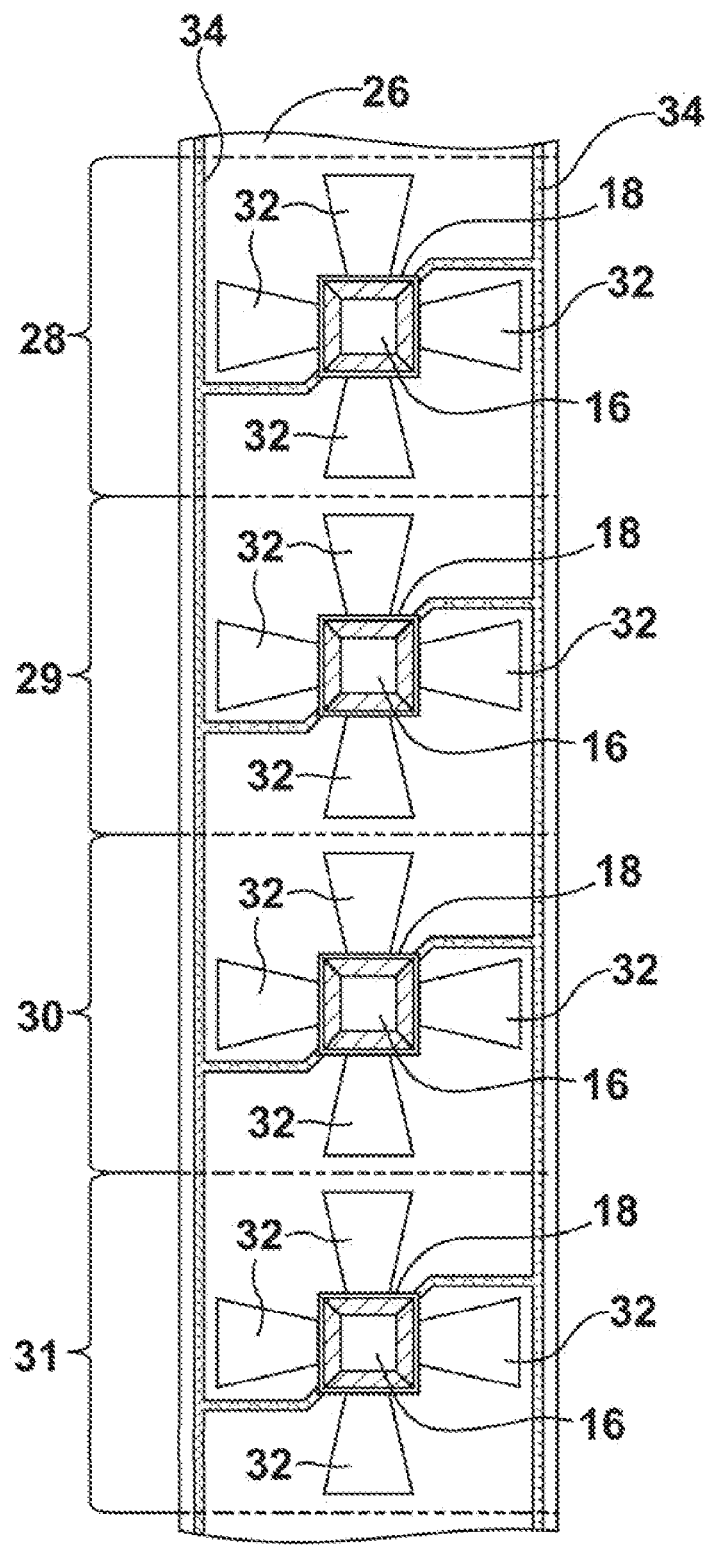
FIG. 3 is a top view of the arrangement of FIG. 2, but omitting the lenses of FIG. 2.

FIG. 3 shows the substrate 26 of FIG. 2 with sequential segments 28, 29, 30 and 31 along a longitudinal axis (not shown). Each segment preferably has the same structures, including a light collecting or emitting device 16 and a light coupler 18. Voids 32 are associated with the formation of light couplers 18, as will be described below. Electrical leads 34 are provided on the flexible substrate, which may be a polymer, such as KAPTON-brand polyimide film, which available from E. I. Du Pont De Nemours and Company of Wilmington, Del., USA. Such KAPTON-brand film can be supplied with electrical leads 34 already formed on the film. Electrical leads 34 are shown with cross-hatching for purposes of clarity, not to indicate actual cross-hatching. Other electrical structures, such as p-n diodes (not shown) or sensors (not shown) could be formed on the substrate 26. The substrate 26 may be formed other polymeric materials, or even metallic foils on which suitable electrical insulation is provided to isolate electrical leads 34. As will become clear from the description below, the substrate 26 should be suitable for formation thereon of optical reflectors for forming light couplers 18, and preferably should be suitable for formation thereon of dichroic mirrors for some embodiments.

Figure 4:
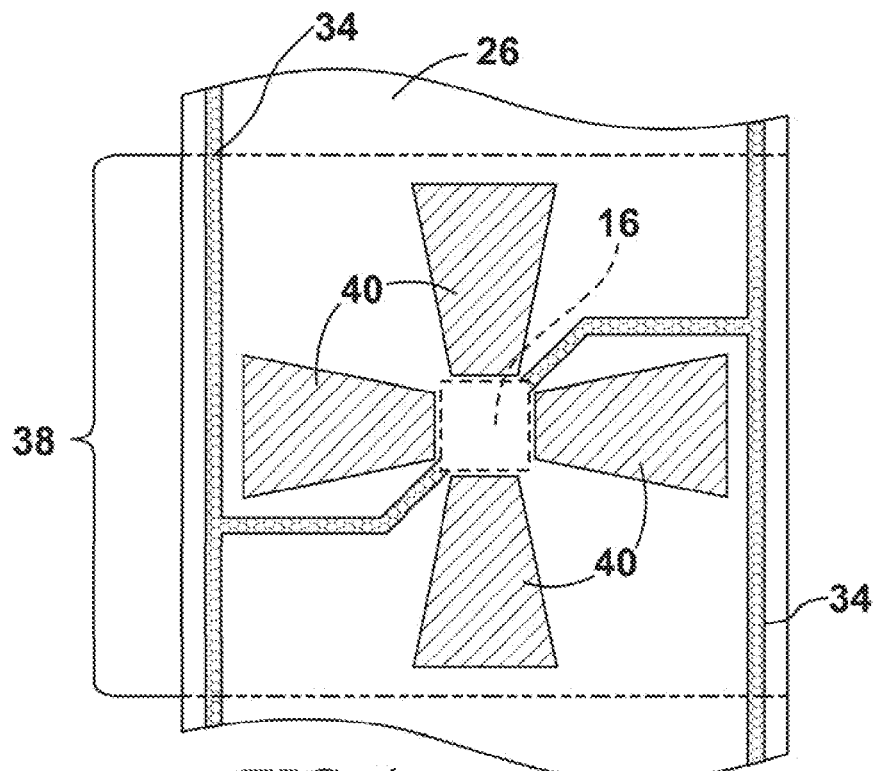
FIG. 4 is a top view of a segment of the substrate of FIG. 3 on which reflective areas are formed for the purpose of making a light coupler.
Figure 5:
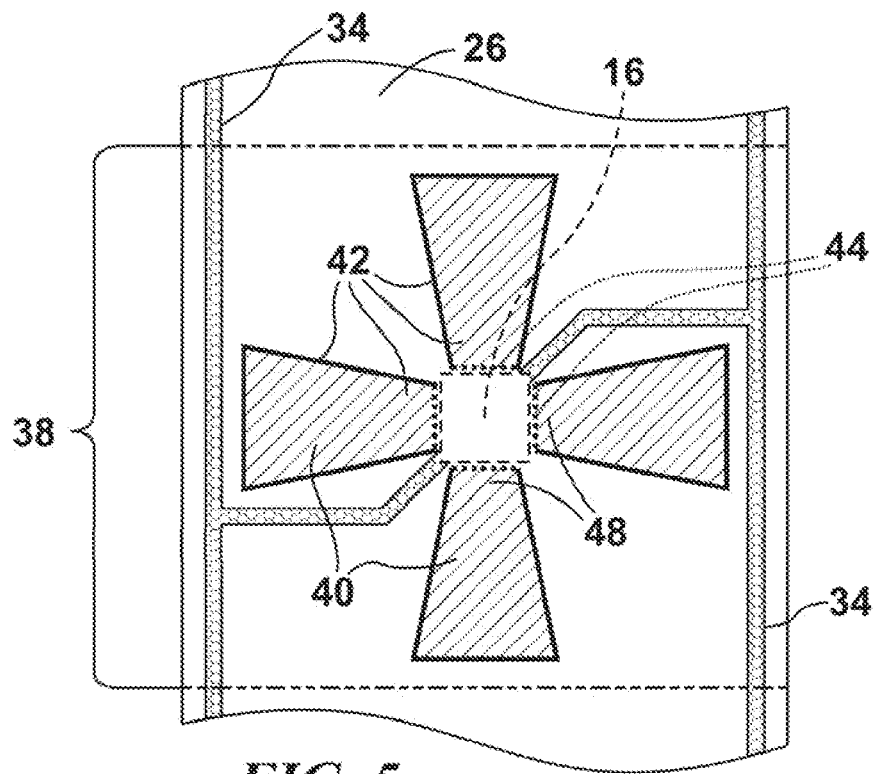
FIG. 5 is a top view of the segment of substrate shown in FIG. 4, which undergoes a die-cutting operation.
Figure 6:
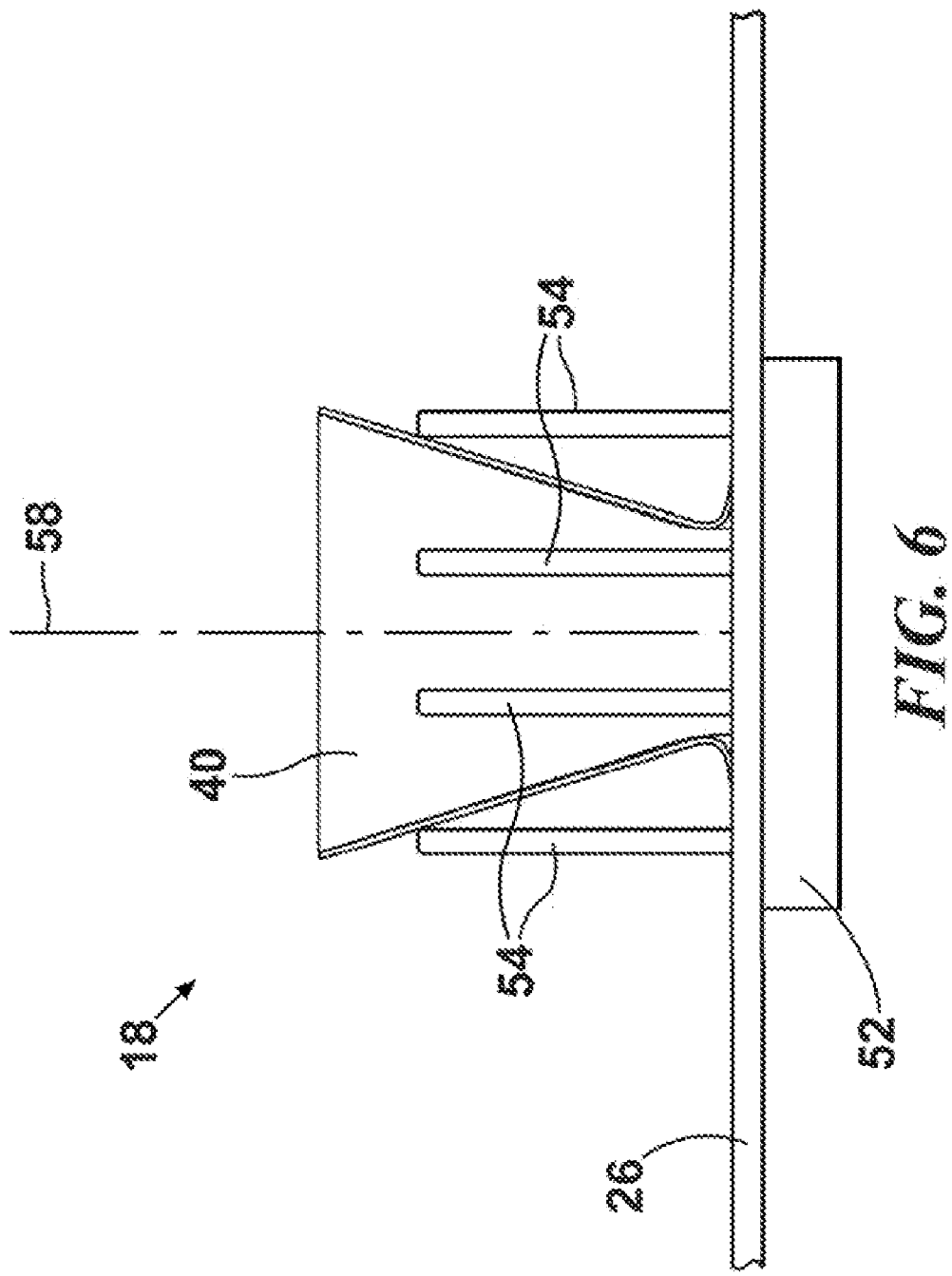
FIG. 6 is a side view of the substrate of FIG. 5 after undergoing a folding operation, etc., to form a light coupler.

Light couplers 18 of FIGS. 2 and 3 may be formed as shown in FIGS. 4, 5 and 6.

FIG. 4 shows a segment 38 of substrate 26 on which a light coupler is to be formed. The future location of light collecting or emitting device 16 is shown in phantom, and the electrical leads 34 are preferably already formed on the substrate. A masking operation (not shown) is undertaken to allow reflectors 40 to be formed by application of reflective material to unmasked areas of the substrate. Reflectors 40 are shown with diagonal cross-hatching for clarity, not to indicate actual cross-hatching.

FIG. 5 shows segment 38 of substrate 26, which undergoes a die-cutting procedure for forming cut lines 42 (shown in bold) and fold lines 44, shown as a series of solid dots. FIG. 5 also shows resulting connecting bands 48, which connect reflectors 40 to substrate 26 via fold lines 44.

FIG. 6 shows a light coupler 18, formed from the four reflectors 40 of FIGS. 4 and 5, after those reflectors have been folded upwardly, away from the plane of the substrate 26. A supporting apparatus 52 has upwardly oriented arms 54 for holding reflectors 40 in place. The light coupler 20 is preferably substantially closed about a main axis 58 of light propagation to or from the respective light collecting or emitting device 16. For the purposes of this specification, "substantially closed" means at least 320 degrees about axis 58.

Figure 7:
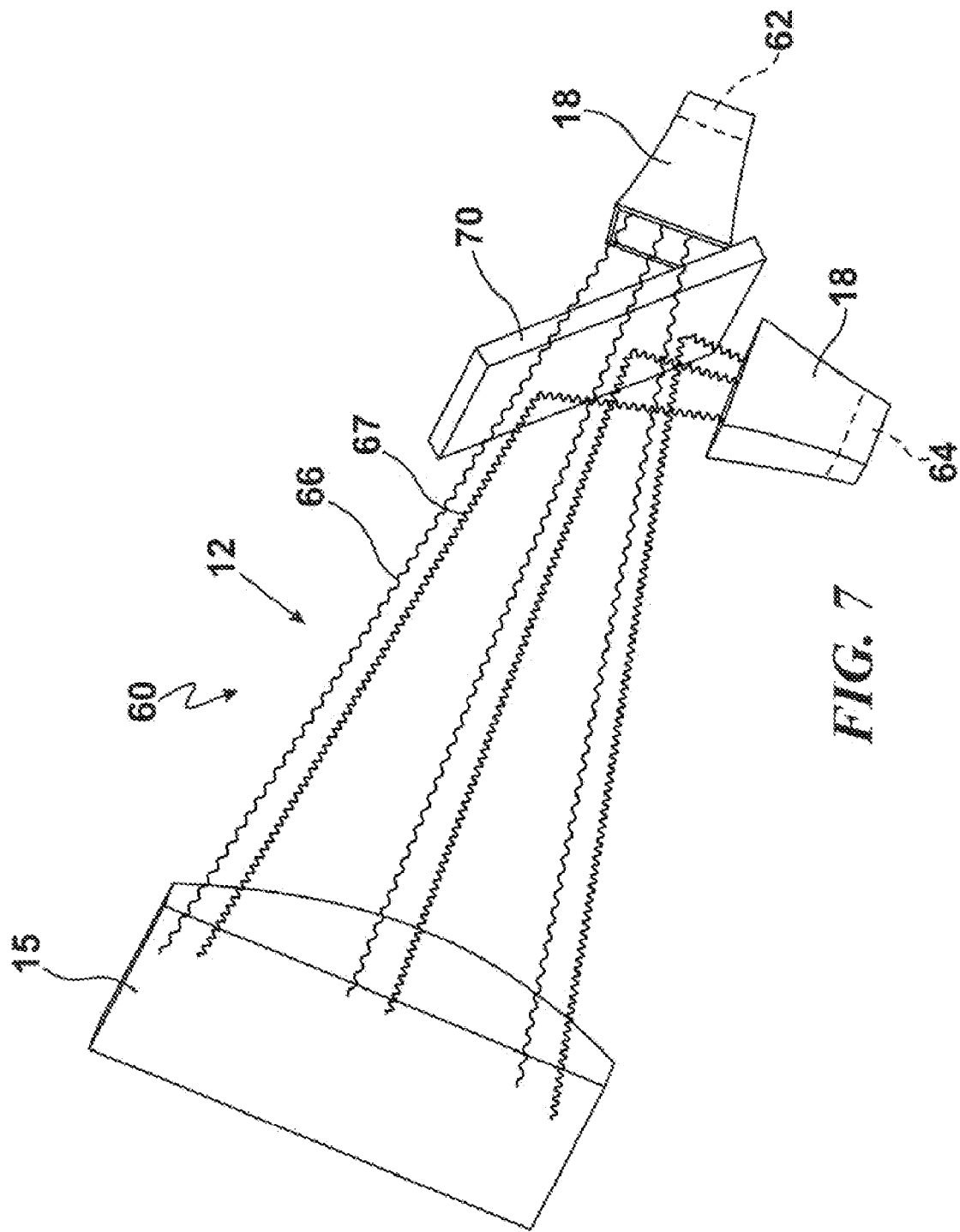
FIG. 7 is a perspective view of a conceptual arrangement for transmitting light between a lens and a pair of light collecting or emitting devices, via a dichroic mirror.

FIG. 7 shows a conceptual arrangement 60 for the transmission of light 12 between a lens 15 and light collecting or light emitting devices 62 and 64. Light 12 contains relatively longer wavelength light 66 and relatively shorter wavelength light 67, each of which may span a range of wavelengths. A dichroic mirror 70 is preferably designed to pass longer wavelength light 66 between light collecting or emitting device 62 and a lens 15 via a light coupler 18, and to reflect shorter wavelength light 68 between light collecting or emitting device 64 and a lens 15 via a light coupler. The longer and shorter wavelengths are separated by an intermediate wavelength, typically referred to as a cut-off frequency in relation to wavelengths allowed to pass though, or be reflected by, the mirror. These "wavelength" relations are intended to apply to other instances of use of reference numerals 62 and 64 in this specification. PV cells 62 and 64 are preferably each chosen to have appropriate bandgap or bandgaps to efficiently convert into electricity most of the light that impinges on them.

Dichroic mirror 70 preferably comprises a long-wave-pass dichroic filter, which may be formed of alternating layers of materials such as those selected from silica, titania, tantala, zirconia, mag-flouride, or Zinc-Sulphide (ZnS).

Single-Substrate, Double-Sided Design

Figure 8:
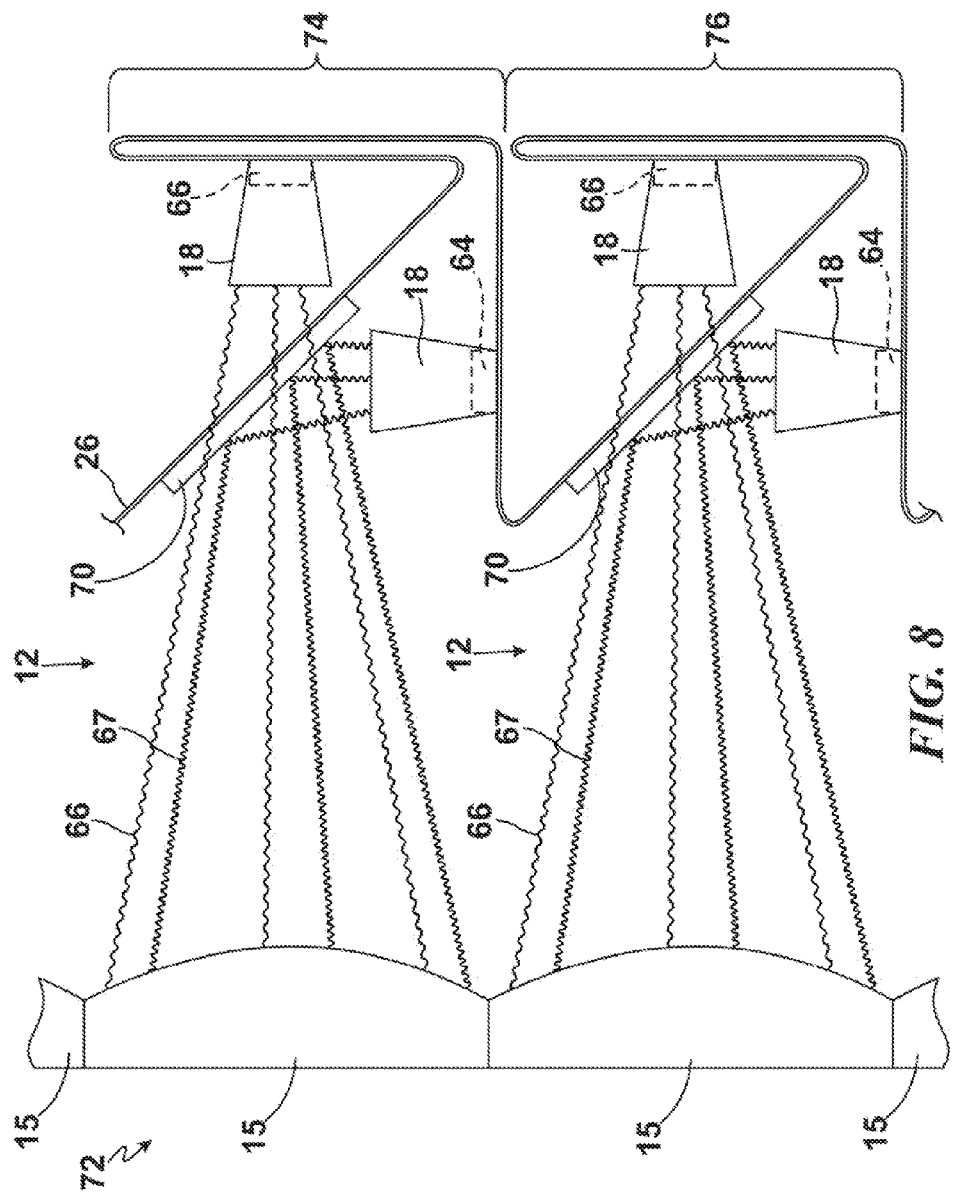
FIG. 8 is a side view of an arrangement that implements the arrangement of FIG. 7.

To make arrangement 60 of FIG. 7 in a simple and economical manner, the present inventors have developed arrangement 72 of FIG. 8. Arrangement 72 includes structures 74 and 76, which are preferably identical to each other and so each may be considered a repeated unit of arrangement 72, apart from the lenses 15.

Repeated structure 74 includes all the structures described in FIG. 7, and also a single flexible substrate 26 upon which the light collecting or light emitting devices 64 and 66 and dichroic mirror 70 are mounted.

Figure 9:
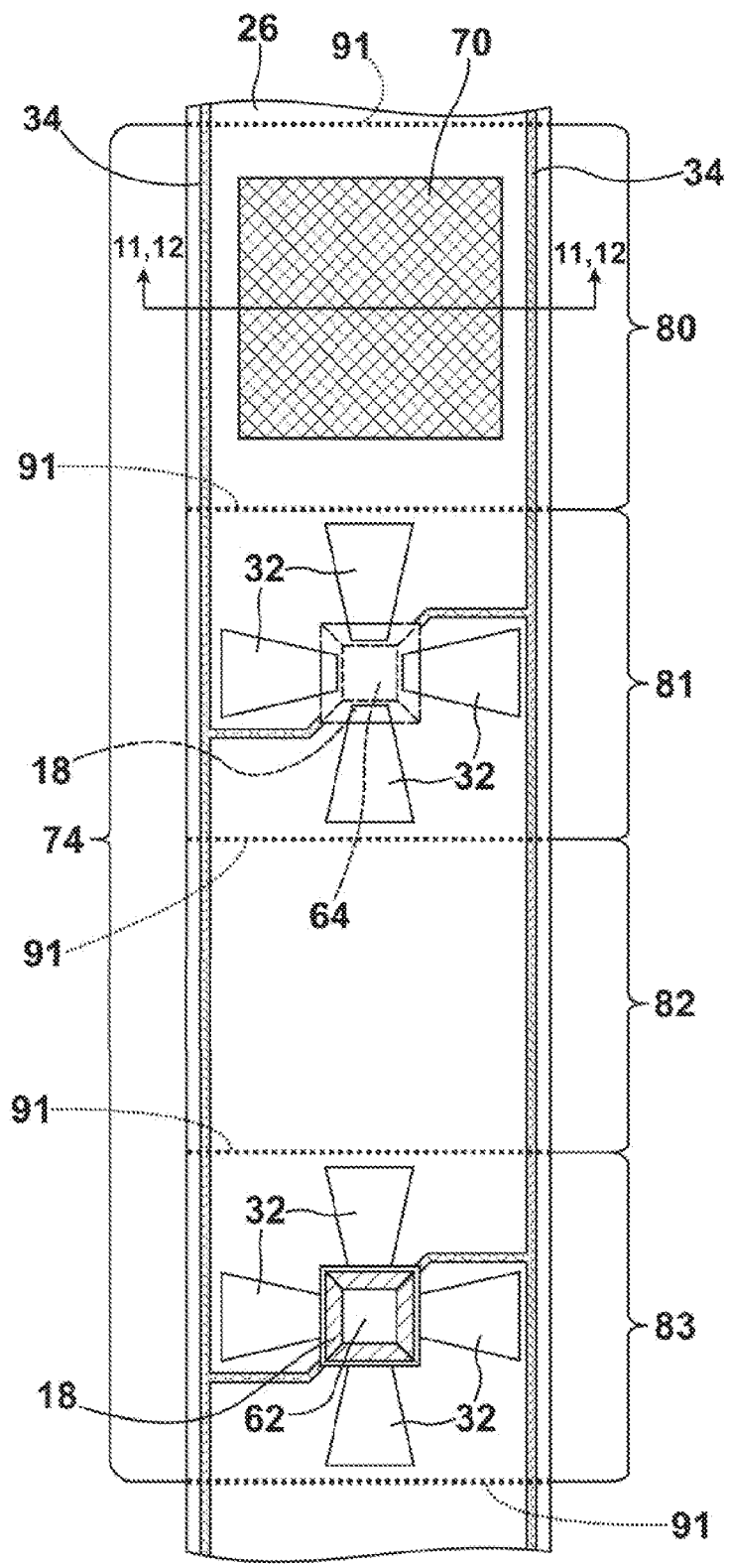
FIG. 9 is a top view of a substrate and associated structures that may be used to form the arrangement of FIG. 8.

The repeated structure 74 of FIG. 8 may be formed from the substrate 26 of FIG. 9. As shown in FIG. 9, repeated structure 74 includes first segment 80, second segment 81, third segment 82 and fourth segment 83, which may be of similar or equal lengths. The first segment 80 has a dichroic mirror 70 formed thereon, shown with cross hatching for purposes of clarity, not to actually indicate cross-hatching. Dichroic mirror 70 may be formed in various ways, as explained below in connection with FIGS. 10 and 11. The second and fourth segments 81 and 83 have light couplers 18 mounted thereon, but on opposite sides of the substrate 26. In particular, light coupler 18 in second segment 81 is located on the underside of substrate 26, whereas light coupler 18 in fourth segment 83 is located on the upper, or visible, side of substrate 26. Light coupler 18 on the underside of substrate 26 is provided with electrical leads (not shown) on the underside of substrate 26, similar to leads 34 on the upper side of the substrate. Accordingly, the foregoing design of FIG. 9 is double-sided from the perspective of the substrate 26. Finally, third segment 82 may lack a light collecting or emitting device 18 or a dichroic mirror 70.

Figure 10:
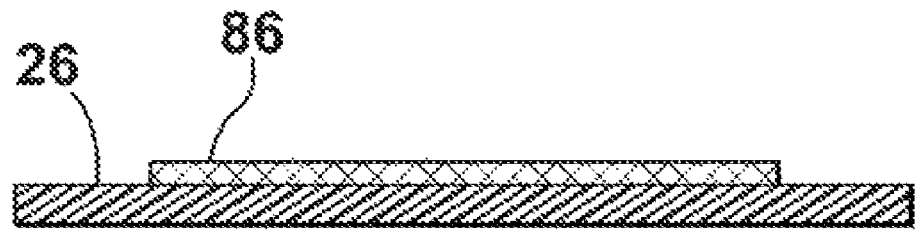
FIG. 10 is a cross section of a substrate and dichroic mirror taken at arrows 11, 11 in FIG. 9.

In FIG. 10, a dichroic mirror 86 implements dichroic mirror 70 of FIG. 9, as a layer of suitable material atop substrate 26. When the dichroic mirror 86 reflects light in at least one range of wavelengths and allows light to pass through the reflector in at least one other range of wavelengths, the substrate 26 is preferably selected to allow at least 70 percent of the light passing through the reflector to pass through the substrate.

Figure 11:
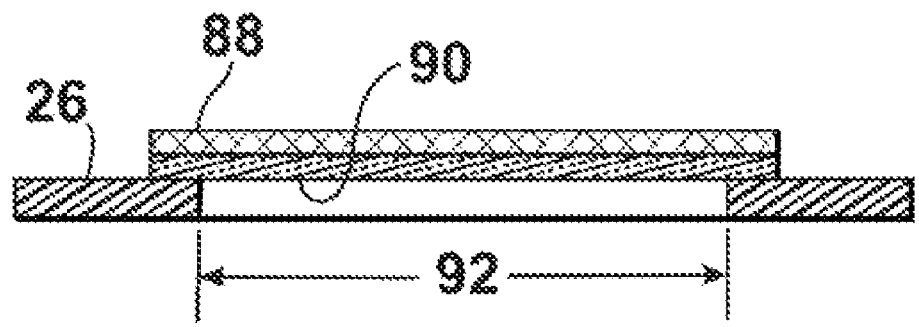
FIG. 11 is an alternative cross section of a substrate and dichroic mirror taken at arrows 12, 12 in FIG. 9.

FIG. 11 shows an alternative dichroic mirror 88 mounted atop a glass substrate 90, which in turn is affixed to the substrate 26. In this embodiment, material of substrate 26 has been removed along dimension 92 and along an orthogonal direction (not shown). Thus, light which passes through dichroic mirror 88 and glass substrate 90 avoids passing through substrate 26, which allows more flexibility in choosing a material for substrate 26 compared with the embodiment of FIG. 10.

Returning to FIG. 9, the substrate will be suitably folded to achieve the structure shown in FIG. 8. In this connection, fold lines 91 are preferably provided on substrate 26 as shown in FIG. 9 between adjacent segments 80, 81, 82 and 93.

Single-Substrate, Single-Side Design

Figure 12:
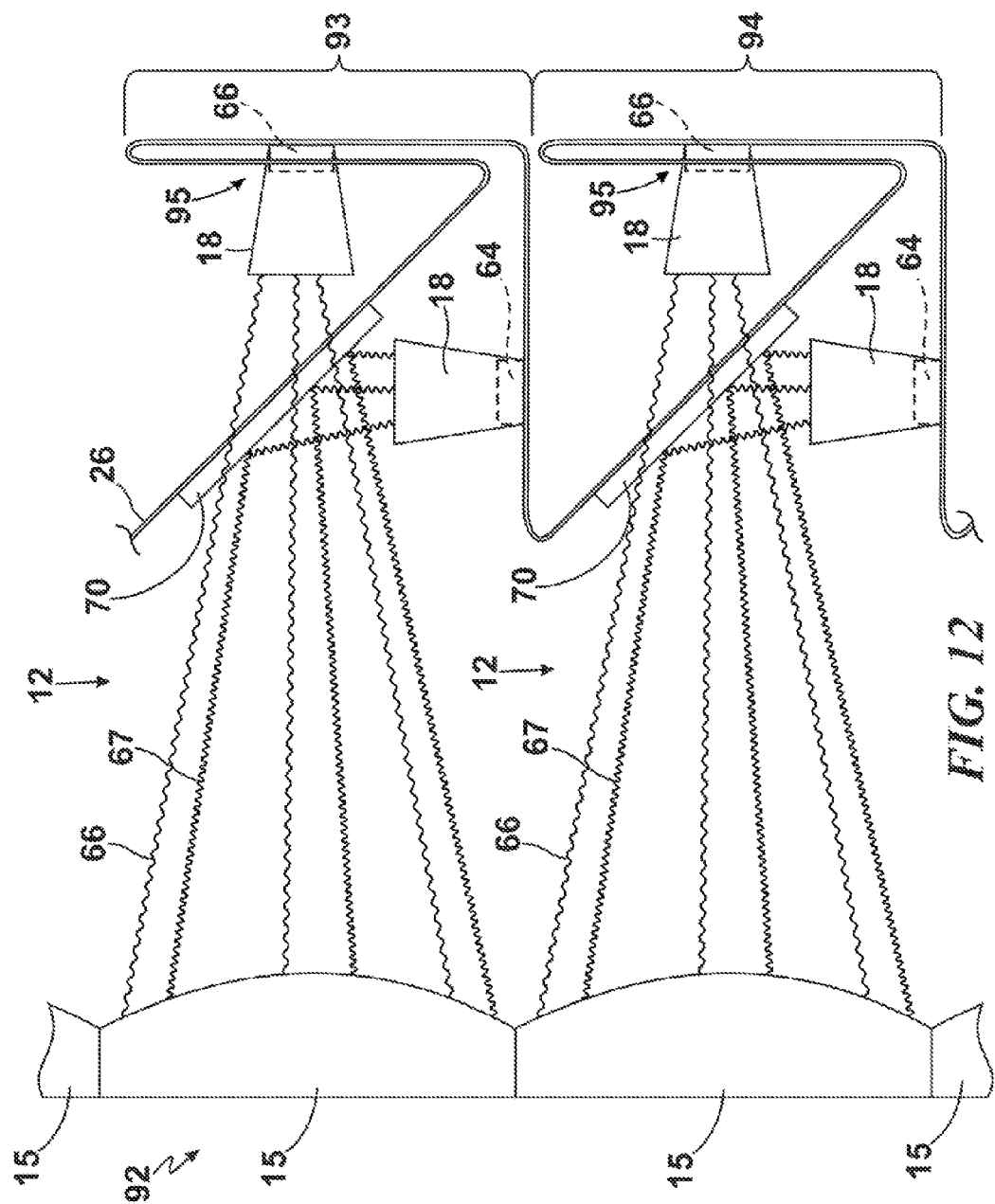
FIG. 12 is a side view of an arrangement alternative to that of FIG. 8 for implementing the arrangement of FIG. 7.

FIG. 12 shows an arrangement 92 for implementing the arrangement of FIG. 7, which is an alternative to the arrangement 72 of FIG. 8. A key difference from arrangement 72 of FIG. 8 is that, in the arrangement 92 of FIG. 12, the light collecting or emitting devices 64 and 66 and associated light couplers 18, and the dichroic mirrors 70, are all located on the same side of the substrate 26. FIG. 12 includes repeated structures 93 and 94, which are preferably identical to each other.

Figure 13:
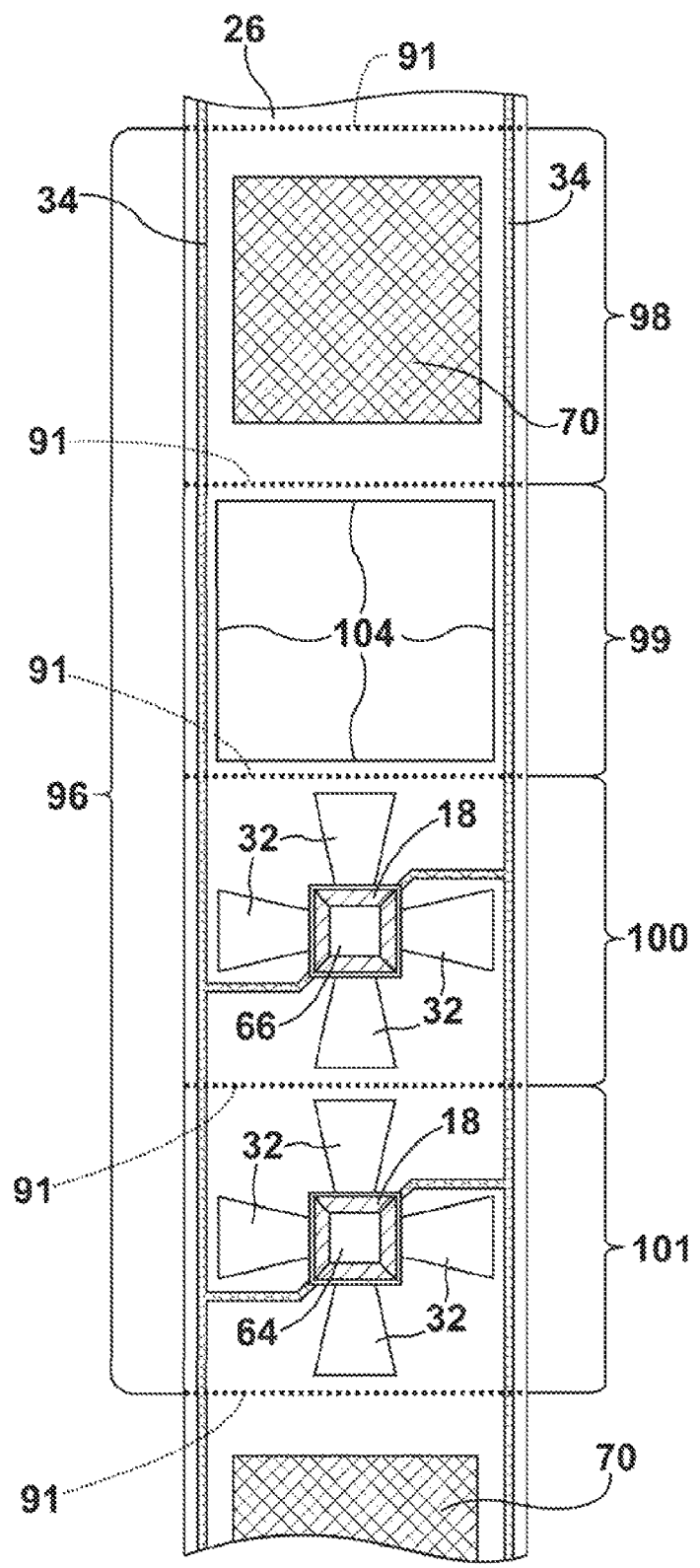
FIG. 13 is a top view of a substrate and associated structures that may be used to form the arrangement of FIG. 12.

FIG. 13 shows a repeated unit 96 of substrate 26 and associated structures, and may be the same as either of repeated structures 93 and 94 in FIG. 12 although in a state in which the substrate 26 is flat. Unit 96 includes first segment 98, second segment 99, third segment 100 and fourth segment 101, which may have similar or equal lengths. The first segment has a dichroic mirror 70; the second segment has a hole through the substrate 26, which is bounded by substrate edges 104. As indicated in FIG. 12, such hole allows couplers 18 associated with devices 66 to pass through the substrate 26 at locations 95. The third segment has a light collecting or emitting device 66 and associated light coupler 18, and the fourth segment has a light collecting or emitting device 64 and associated light coupler 18.

The substrate 26 of FIG. 13 will be folded to form the configuration shown in FIG. 12. In this connection, fold lines 91 are preferably provided on substrate 26 of FIG. 13 between adjacent segments 98 and 99, 99 and 100, and 100 and 101, for instance.

Double-Substrate, Single-Sided Design

Figure 14:
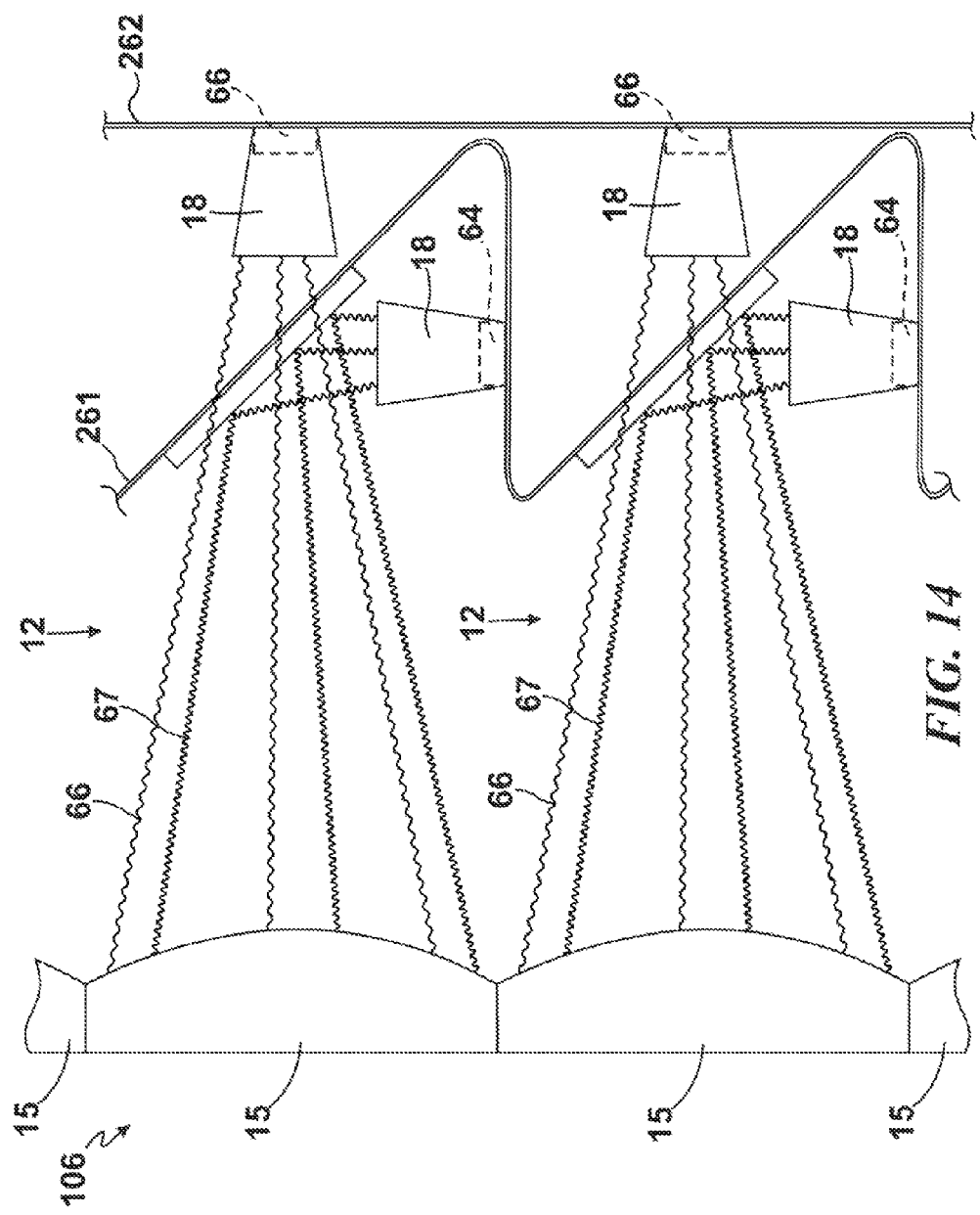
FIG. 14 is a side view of another arrangement alternative to that of FIG. 8 for implementing the arrangement of FIG. 7.

FIG. 14 shows an arrangement 106 for implementing the arrangement of FIG. 7 differently from the arrangements of FIGS. 8 and 12. One key difference is that the arrangement 106 of FIG. 14 uses two substrates 261 and 262, each of which has similarities to the single substrate 26 as referred to in the foregoing embodiments.

Figures 15, 16:
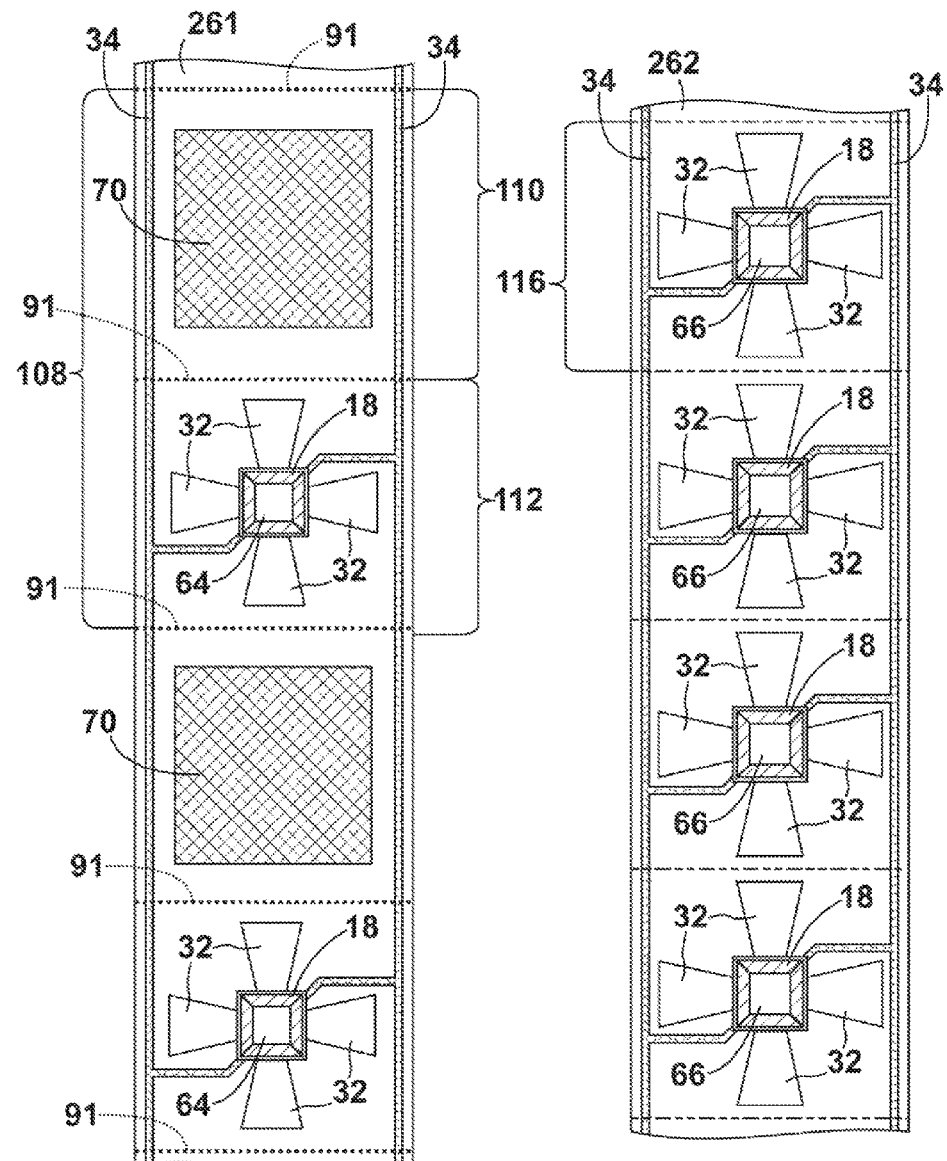
FIGS. 15 and 16 are top views of first and second substrate portions that cooperate together to implement the arrangement of FIG. 14.

FIG. 15 shows substrate 261, with a repeated unit 108, comprised of first segment 110 and second segment 112. First segment 70 includes a dichroic mirror 70, and second segment 112 includes a light collecting or emitting device 64 and associated light coupler 18.

FIG. 16 shows substrate 262 with a repeated unit 116, which includes a light collecting or emitting device 66 and associated light coupler 18.

The substrate 261 of FIG. 15 will be folded and indexed with the substrate 262 of FIG. 16 to form arrangement 106 of FIG. 14. In this connection, fold lines 91 are preferably provided on substrate 261 as shown in FIG. 15, respectively, between adjacent segments 110 and 112, for instance.

Another Single-Substrate, Single-Sided Design

Figure 17:
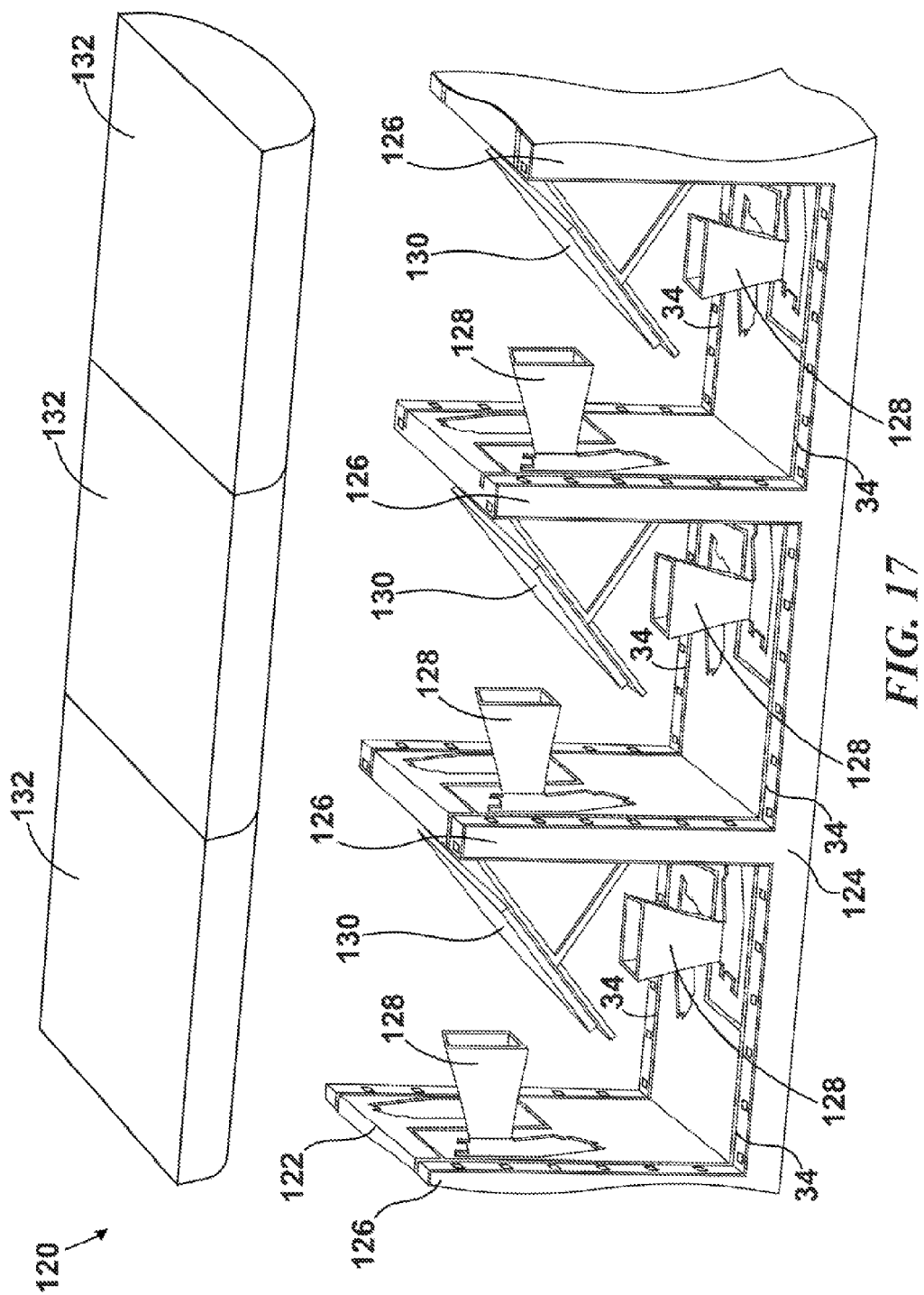
FIG. 17 is a perspective view of an arrangement for transmitting light between a lens and a light collecting or emitting device, in accordance with a further embodiment of the invention.

FIG. 17 shows an arrangement 120 in accordance with a further embodiment of the invention. Arrangement 120 includes a single substrate 122 that may be mounted onto the upper surface of a base 124 and onto vertical and horizontal surfaces of walls 126 that extend vertically upwards from the base 124. Incidentally, the foregoing and other references to orientation herein, such as horizontal or vertical, are only intended for convenience of illustration. As such, the "vertical" surface of a wall 126 may be oriented other than vertically in use.

Light couplers 128 are formed partly from substrate 122 and are similar to light couplers 18 described in the foregoing embodiments. Light collecting or emitting devices 62 and 64 are disposed on the substrate 122, and each is surrounded by an associated, respective light coupler 128. As with the prior embodiments, leads 34 are provided on substrate 122 for interconnecting to light collecting or emitting devices 62 and 64. Dichroic mirrors 130 are used in a similar fashion to dichroic mirrors 70 described in the foregoing embodiments, for receiving light from, or transmitting light to, respective lenses 132.

Figure 18:
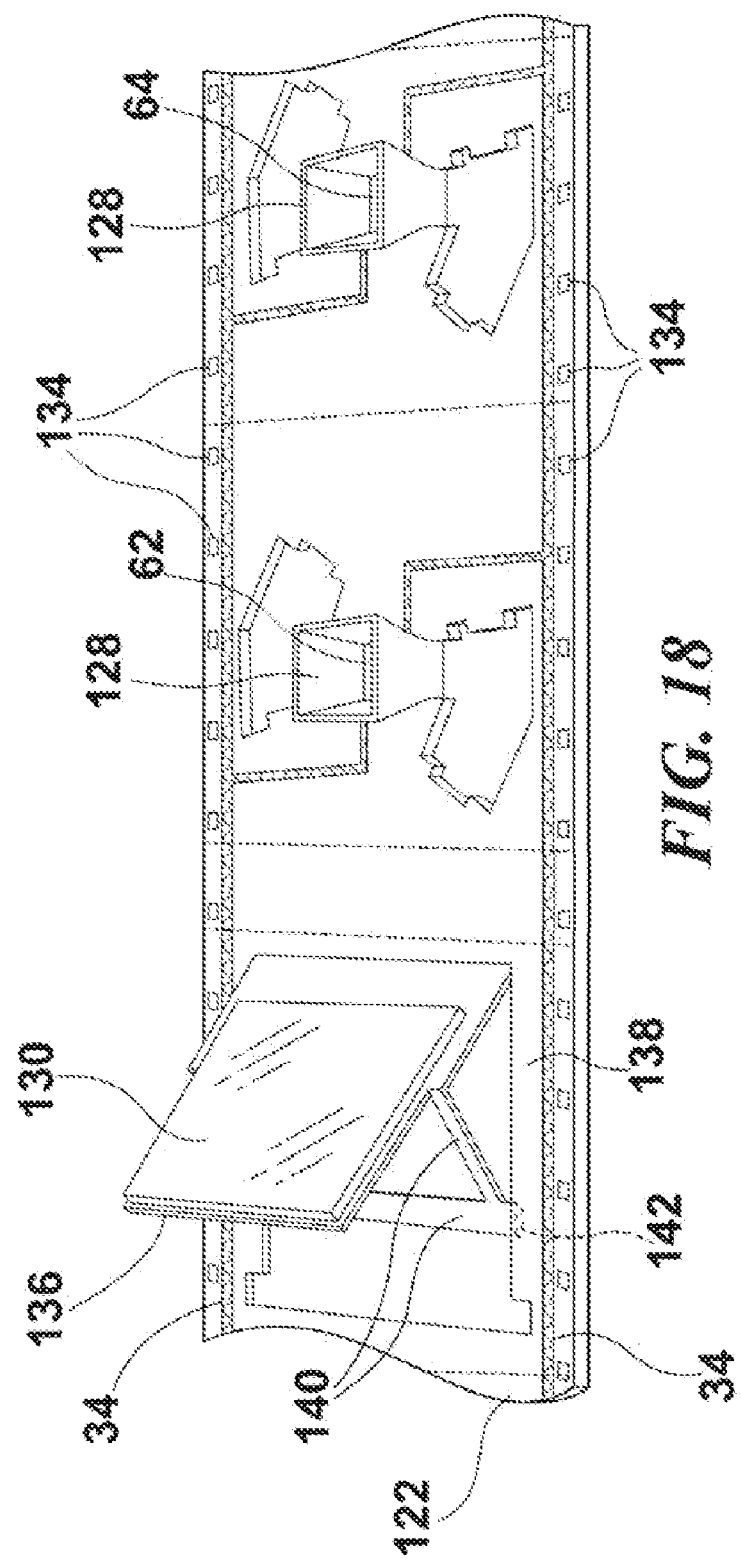
FIG. 18 is a perspective view of the substrate and associated structures of the arrangement of FIG. 17 prior to being folded into the shape shown in FIG. 17.

FIG. 18 shows substrate 122 in a flat state, before being folded about walls 126 of the arrangement 120 of FIG. 17. Substrate 122 includes indexing marks or holes 134, to facilitate automation in making of various structures on the substrate. The substrates of the previously described embodiments may also include indexing marks or holes (not shown).

Dichroic mirror 130 is formed on a portion 136 of the substrate 122. Advantageously, after formation of mirror 130, portion 136 may be angled away from that portion 138 of the substrate upon which the dichroic mirror 130 is mounted. This is accomplished by making appropriate cut lines, as also described also in connection with FIG. 20 below, so as to form, from the substrate 122, a U-shaped support 140 for the dichroic mirror. U-shaped support 140 has tabs 142 (see also FIG. 20) that can be slid under substrate portion 138 to help maintain the reflector in a desired position.

Figure 19:
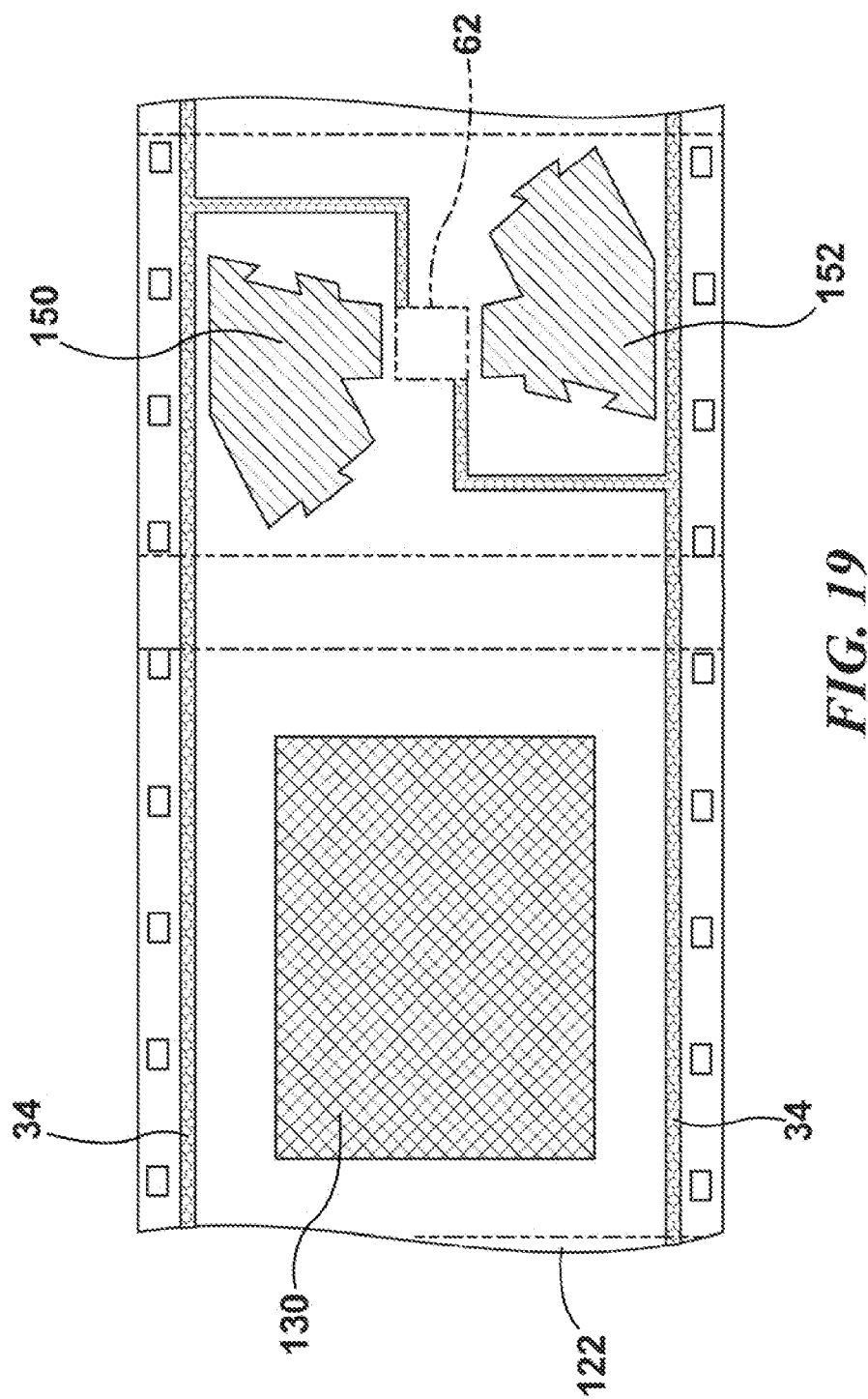
FIG. 19 is a top view of a segment of the substrate of FIG. 18 on which respective reflective areas are formed for the purpose of making a light coupler and a dichroic mirror.

FIG. 19 shows a segment of substrate 122 on which a light coupler 128 and dichroic mirror 130 of FIG. 18 are to be formed. The future location of light collecting or emitting device 62 is shown in phantom, and the electrical leads 34 are preferably already formed on the substrate. A masking operation (not shown) is undertaken to allow reflectors 150 and 152 to be formed by application of reflective material to unmasked portions of the substrate. Reflectors 150 and 152 are shown with diagonal cross-hatching for clarity, not to indicate actual cross-hatching. Additionally, a masking operation (not shown) is undertaken to form dichroic mirror 130, shown in cross-hatching for convenience, not to indicate actual cross-hatching.

Figure 20:
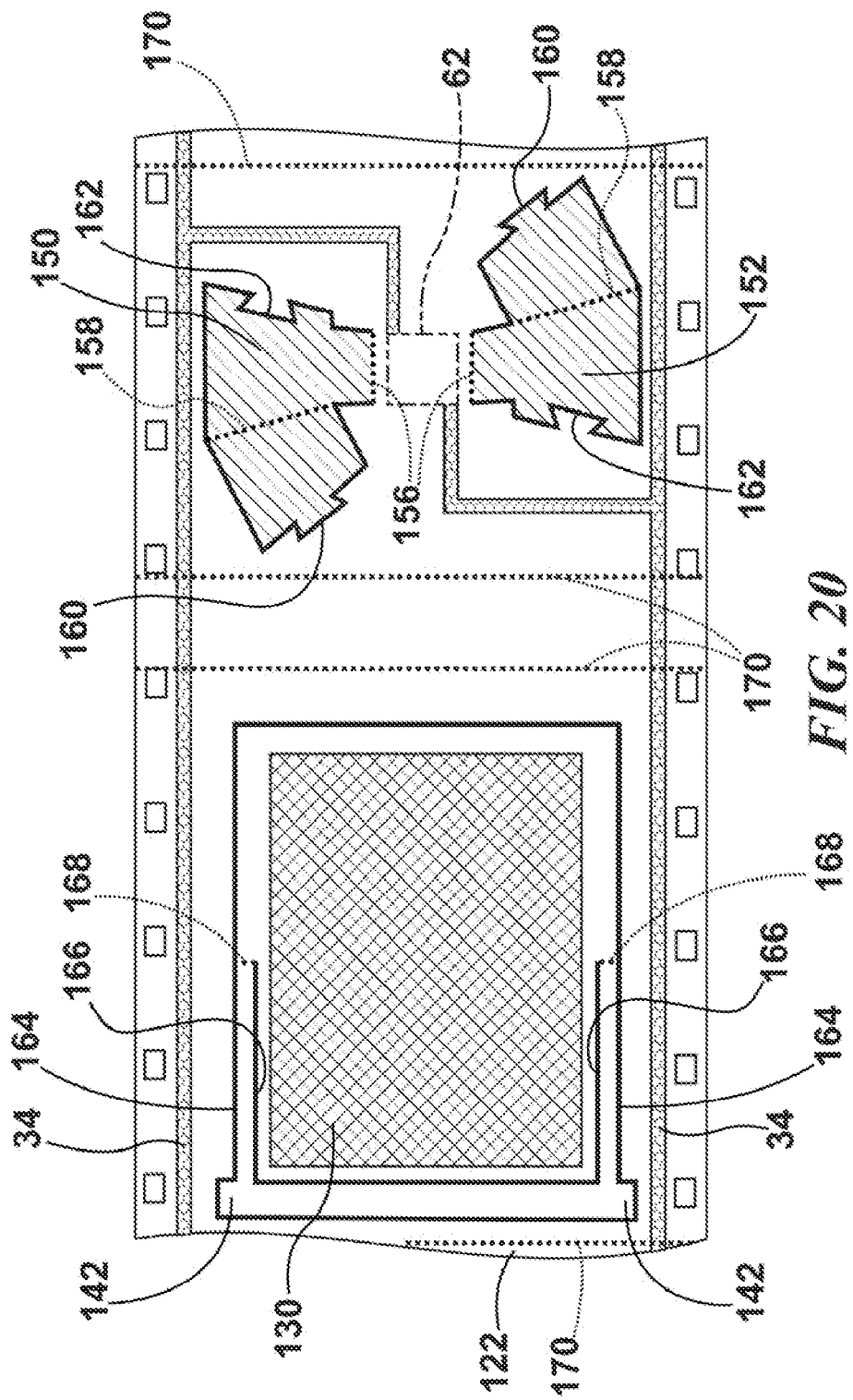
FIG. 20 is a top view of the segment of substrate shown in FIG. 19, which undergoes a die-cutting operation.

FIG. 20 shows the segment of the substrate 122 from FIG. 19, which undergoes a die-cutting operation. In particular, cut lines in bold at the periphery of reflectors 150 and 152 are provided, and fold lines 156, where each of reflectors 150 and 152 connect to the substrate 122, are shown as a series of dots. As can be seen, each of reflectors 150 and 152 has a tab 160 and a slot 162, whose cooperation is described below. Fold lines 158 between adjacent facets of each of the reflectors 150 and 152 are also shown as a series of dots.

For forming U-shaped structure 140 and associated structures, FIG. 20 shows outer cut lines 164 and inner cut lines 166 used in forming the structure 140. Fold lines 168 may be provided to facilitate subsequent angling of the dichroic mirror 130 away from portion 138 (FIG. 18) of the substrate 122.

Other fold lines 170 are preferably provided to facilitate folding of the substrate 122 into the final shapes shown in FIG. 17.

After the die-cutting operation shown in FIG. 20, the reflectors 150 and 152 are brought together, and tabs 160 are inserted into slots 162, to maintain the desired shape of the resulting light coupler 128 as shown in FIG. 17, which is suitably the same desired shape as for the light couplers 18 of earlier figures.

Figure 21:
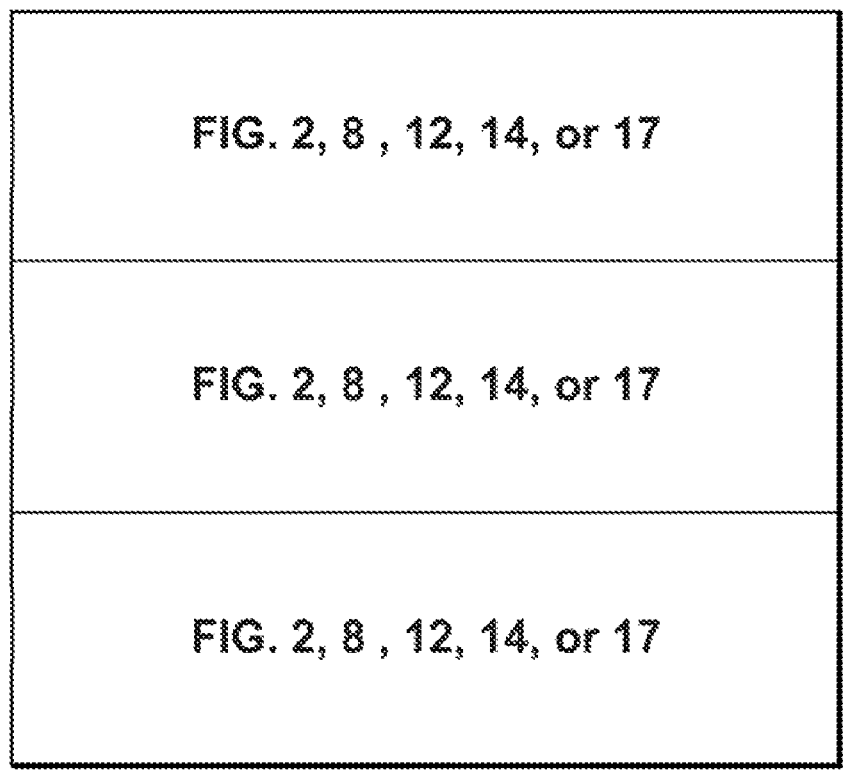
FIG. 21 is a block diagram view of an array of arrangements such as shown in various of the prior figures.

FIG. 21 shows a block diagram 133 of arrays of arrangements 24, 72, 92, 106 or 120 such as shown in FIGS. 2, 8, 12, 14 and 17, respectively. The resulting array of such arrangements 24, 72, 92, 106 or 120 can serve to receive sunlight, for instance, over a wide area, for conversion into electricity.

Manufacturing Considerations

In addition to various manufacturing considerations mentioned above, further manufacturing considerations are as follows. The reflectors and dichroic mirrors mentioned above can be composed of conventional materials applied through various deposition processes. For instance, the reflectors can typically be made of metal, or other materials such as $TiO_2$, $SiO_2$, $MgF_2$. The dichroic mirrors can be typically made of the materials mentioned above, or with materials such as $TiO_2$, $SiO_2$ or $MgF_2$. Suitable deposition processes include chemical vapor deposition, vacuum deposition, physical vapor deposition and any other deposition process that deposits materials onto substrates. The reflectors, mirrors and other devices are preferably created on a substrate while associated portions of the substrate are flat.

The substrate can be processed in a roll-to-roll means, with rolls of substrate 1000 feet (305 meters) or longer. The rolls can be tensioned, by undulating them through a series of rollers with appropriate springs. The substrate can be coated in a deposition process by indexing the film in a step-like manner in the coater, coating a portion of the roll at a time and allowing the coater to run continuously until the substrate roll is empty. Masks in the coater can provide different shapes of deposited material on the substrate at different points along the substrate roll.

When the reflectors are cut from the substrate and folded, ultrasonic welding can be used to connect the edges of the light couplers together to hold their shape.

The substrates described can be rigid, with the desired shapes thermoformed or vacuum formed with coatings for the reflectors and dichroic mirrors applied prior to thermoforming or vacuum forming.

Folding of components, such as a reflector, can be done along the main longitudinal axis of a roll of substrate material, perpendicular to the roll or in any other direction with respect to the axis of the roll.

Reflectors could fall into the class of Ruled Shapes, but can be composed of any class of shapes. The light couplers formed from the reflectors can maintain a constant cross area shape along the main axis of light propagation therethrough, or the shape of the cross-section may change along such main axis.

The substrate can be printed (or coated) directly with materials to form LEDs or PV cells and the required reflectors and mirrors. The reflectors and dichroic mirrors are then folded or bent into final position as necessary.

The full width of the substrate or the full width of a coating machine, whichever is smallest, could be used to create a wide sheet of coated substrate. The desired arrangement is then created by cutting and folding as necessary multiple light coupler, dichroic mirror and light collecting or emitting devices and configuring the substrates and aligning them with any cooperating substrate.

The arrangement could be assembled and the individual parts or the entire arrangement encapsulated in optically transparent plastic. The collectors could be shaped and act as molds for the transparent plastic, creating a solid optical component.

The foregoing specification describes a method of making an arrangement for collecting (or emitting) light, key parts of which can be performed using automated, mass production techniques. The foregoing specification further describes such a method in which the arrangement for collecting light forms a two-axis concentrator with a medium level of concentration, in which the need for a high level of tracking accuracy is reduced, allowing for lower cost options for tracking equipment.

While the invention has been described with respect to specific embodiments by way of illustration, many modifications and changes will occur to those skilled in the art. It is, therefore, to be understood that the appended claims are intended to cover all such modifications and changes as fall within the true scope and spirit of the invention.

What is claimed is:

1. A method of making an arrangement for collecting or emitting light, comprising:
  a) providing a flexible sheet of material as a substrate for a plurality of light collecting or emitting devices and for formation of a respective light coupler for each of the plurality of light collecting or emitting devices;
  b) mounting the plurality of light collecting or emitting devices being spaced apart on the sheet, wherein the light collecting or emitting devices convert light into electricity or electricity into light respectively;
  c) the sheet having thereon electrical leads for interconnection to each of the plurality of light collecting or emitting devices; and
  d) for each light collecting or emitting device, forming a respective light coupler by forming a plurality of reflectors on the sheet around the intended periphery of the respective light collecting or emitting device, by—
    i) applying reflective material to selected areas of the sheet to be formed into reflectors;
    ii) selectively forming cut lines and fold lines around substantially the full periphery of each of said selected areas; and
    iii) folding each of the selected areas of the sheet, about said fold lines, away from a plane of a portion of the sheet on which the light collecting or emitting device is mounted, such that a light coupler is formed, wherein the interior of the coupler is reflective and the coupler is substantially closed around a main axis of light propagation into or from the respective light collecting or emitting device.

2. The method of claim 1, wherein each light coupler is formed of four reflector facets, only two of which facets have a direct connection to the sheet, via respective fold lines, and the other two of which facets are each connected to an associated facet via a respective fold line.

3. The method of claim 1, wherein respective dichroic mirrors are formed on a sheet portion, each dichroic mirror being associated with at least a respective one of the mentioned light collecting or emitting devices.

4. The method of claim 3, wherein:
a) the respective dichroic mirror is formed on a sheet by applying a layer of dichroic material to the foregoing sheet portion;
b) the dichroic mirror reflecting light in a first range of wavelengths and allowing light to pass through the reflector in a second range of wavelengths; the first and second wavelengths being separated by an intermediate wavelength; the sheet being selected to allow at least 70 percent of the light passing through the reflector to pass through the sheet.

5. The method of claim 4, wherein the dichroic mirror formed in such as way that it can be angled away from that portion of the sheet on which it is mounted by—
a) forming a fold line associated with an edge of the dichroic mirror;
b) forming a first set of cut lines around other edges of the dichroic mirror; the fold line and first set of cut lines forming a closed loop around more than 95 percent of the periphery of the reflector;
c) forming a second set of cut lines around a periphery of the dichroic mirror distal from the foregoing fold line and continuing on each side of the foregoing periphery towards the foregoing fold line, so as to form a U-shaped support for the dichroic mirror; and
d) folding the dichroic mirror about the foregoing fold line and folding the U-shaped support away from the reflector so as to be able to support the reflector in an orientation angled away from that portion of the sheet on which said reflector is mounted.

6. The method of claim 4, wherein said first range of wavelengths is shorter than said second range of wavelengths.

7. The method of claim 3, wherein the respective dichroic mirror material is formed on a sheet by cutting a hole in the sheet and covering the hole with a dichroic mirror.

8. The method of claim 3, comprising folding a sheet such that—
a) light passing through one of the mentioned dichroic mirrors is coupled by one of the mentioned light couplers between one of the mentioned light collecting or emitting devices and a respective area spaced from the arrangement; and
b) light reflected by the one of the mentioned dichroic mirrors is coupled by another of the mentioned light couplers between another of the mentioned light collecting or emitting devices and a respective area spaced from the arrangement.

9. The method of claim 8, wherein:
a) a single flexible sheet is used as substrate for a plurality of light collecting or emitting devices, with repeated units along the length of the sheet;
b) each unit being formed as first through fourth consecutive segments along the length of the sheet;
c) a mentioned dichroic mirror being formed on the first segment on a first side of the sheet;
d) a mentioned light coupler being formed on the second segment on a second side of the sheet;
e) the third segment being devoid of a mentioned dichroic mirror and being devoid of a mentioned light coupler; and
f) a mentioned light coupler being formed on a fourth segment on the first side of the sheet.

10. The method of claim 8, wherein:
a) a single flexible sheet is used as substrate for a plurality of light collecting or emitting devices, with repeated units along the length of the sheet
b) each unit being formed as first through fourth consecutive segments along the length of the sheet;
c) a mentioned dichroic mirror being formed on the first segment on a first side of the sheet;
d) a hole being made in the second segment for allowing one of the mentioned light couplers to protrude therethrough;
e) a mentioned light coupler being formed on the third segment on the first side of the sheet; and
f) another mentioned light coupler being formed on the fourth segment on the first side of the sheet.

11. The method of claim 8, wherein:
a) a single flexible sheet is used as substrate for a plurality of light collecting or emitting devices, with repeated units along the length of the sheet
b) each unit being formed as first through third consecutive segments along the length of the sheet;
c) a mentioned dichroic mirror being formed on the first segment on a first side of the sheet;
d) a mentioned light coupler being formed on the second segment on the first side of the sheet; and
e) another mentioned light coupler being formed on the third segment on the first side of the sheet.

12. The method of claim 11, further comprising providing a base and spaced, upstanding walls mounted to the base for supporting said single sheet, wherein:
a) the first segment with the dichroic mirror is mounted on a first side of one of the upstanding walls;
b) the second segment with a light coupler is mounted on a base on a second side of said one of the upstanding walls; and
c) the third segment with a light coupler is mounted to an upstanding wall that is adjacent to said one of the upstanding walls.

13. The method of claim 8, wherein:
a) first and second flexible sheets are used as respective substrates for respective pluralities of light collecting or emitting devices, each sheet having repeated units along their respective lengths;
b) each unit being formed by respective sheet segment or segments along the length of the respective sheets;
c) a mentioned dichroic mirror being formed on a first segment of the first sheet on a first side of the first sheet;
d) a mentioned light coupler being formed on a second segment of the first sheet, consecutive with the first segment along the length of the first sheet, also on the first side of the first sheet;
e) the foregoing first and second segments of the first sheet constituting a repeated unit in the first sheet along the length of the sheet; and
f) a mentioned light coupler being formed on a first segment of the first side of the second sheet; the foregoing first segment being a repeated unit in the second sheet along the length of the second sheet.

14. The method of claim 1, wherein each of the plurality of the light collecting or emitting devices is a photovoltaic cell.

15. The method of claim 1, wherein each of the plurality of the light collecting or emitting devices is a light-emitting diode.

* * * * *